(12) United States Patent
Sato et al.

(10) Patent No.: US 7,779,538 B2
(45) Date of Patent: Aug. 24, 2010

(54) METHOD FOR MUTUALLY CONNECTING CIRCUIT BOARDS

(75) Inventors: Yoshiaki Sato, Fujisawa (JP); Kohichiro Kawate, Machida (JP); James R. White, Round Rock, TX (US)

(73) Assignee: 3M Innovative Properties Company, St. Paul, MN (US)

( * ) Notice: Subject to any disclaimer, the term of this patent is extended or adjusted under 35 U.S.C. 154(b) by 136 days.

(21) Appl. No.: 11/917,527

(22) PCT Filed: Jun. 21, 2006

(86) PCT No.: PCT/JP2006/023997

§ 371 (c)(1),
(2), (4) Date: Dec. 14, 2007

(87) PCT Pub. No.: WO2007/002099

PCT Pub. Date: Jan. 4, 2007

(65) Prior Publication Data

US 2008/0205019 A1    Aug. 28, 2008

(30) Foreign Application Priority Data

Jun. 24, 2005    (JP) ............................. 2005-185329

(51) Int. Cl.
*H05K 3/36* (2006.01)
(52) U.S. Cl. ............................. 29/830; 29/842; 29/843; 29/857; 29/860; 29/869
(58) Field of Classification Search .................. 29/842, 29/843, 857, 860, 869, 830
See application file for complete search history.

(56) References Cited

U.S. PATENT DOCUMENTS

| 5,418,691 | A  | * | 5/1995  | Tokura ........................ 361/803 |
| 6,274,225 | B1 | * | 8/2001  | Miyake et al. .............. 428/209 |
| 7,080,445 | B2 | * | 7/2006  | Miyake et al. ................ 29/830 |
| 2003/0079341 | A1 | * | 5/2003 | Miyake et al. ................ 29/830 |
| 2008/0110665 | A1 | * | 5/2008 | Satoh et al. .................. 174/254 |
| 2008/0156437 | A1 | * | 7/2008 | Kawate et al. .............. 156/330 |
| 2008/0289859 | A1 | * | 11/2008 | Mikado et al. .............. 174/254 |

FOREIGN PATENT DOCUMENTS

| JP | 06061605 | | 3/1994 |
| JP | 08293656 | | 11/1996 |
| JP | 6-61605 | * | 12/2001 |
| JP | 2003133675 | | 5/2003 |
| JP | 2004319703 | | 11/2004 |
| WO | WO 02/20686 A2 | | 3/2002 |

* cited by examiner

*Primary Examiner*—C. J Arbes (57) ABSTRACT

A method for connecting circuit boards, comprising: (i) preparing a first circuit board having connection parts assigned to end parts of a plurality of conductor wirings, and a second circuit board having connection parts assigned to corresponding end parts of a plurality of conductor wirings; (ii) disposing the connection parts of the first circuit board to face the connection parts of the second circuit board with a thermosetting adhesive film between the connection parts of the circuit boards; and (iii) applying heat and pressure to the connection parts and to the thermosetting adhesive film sufficiently high to thoroughly push away the adhesive film so as to establish electrical contact between connection parts of the circuit boards facing each other and to allow for curing of the adhesive; wherein the conductor wirings constituting the connection parts of at least one of the first and second circuit boards contain non-linear wirings.

10 Claims, 7 Drawing Sheets

METHOD FOR MUTUALLY CONNECTING CIRCUIT BOARDS

CROSS REFERENCE TO RELATED APPLICATIONS

This application is a national stage filing under 35 U.S.C. 371 of PCT/US2006/023997, filed Jun. 21, 2006, which claims priority to Japanese Application No. 2005-185329, filed Jun. 24, 2005, the disclosure of which is incorporated by reference in its/their entirety herein.

FIELD

The present invention relates to a method for mutually connecting circuit boards.

BACKGROUND

In electronic apparatuses such as digital cameras, cell telephones and printers, a circuit board obtained by joining flexible circuit boards (such as flexible printed circuit boards (FPC)) with one another is used in many cases. These electronic apparatuses are becoming small in size and the need for mutually connecting circuit boards having wirings at a fine pitch is increasing.

Connection of a circuit board to another circuit board has been conventionally performed by providing solder bumps on the connection parts of the circuit board, and contacting and soldering the connection parts to the electrodes of another circuit board. However, pitch between connection parts on FPC has become finer, and as the pitch becomes finer, there arises a problem such as short-circuit between adjacent connection parts. Also, when the pitch is fine, the physical strength of the portion for connection is low and connection stability is disadvantageously poor. Therefore, it has been required to develop a method for mutually connecting the circuit boards, which method is free from the problem of short-circuit and assures high reliability of connection.

Connection through an adhesive has been used for the mutual connection of circuit boards of a fine pitch. Such a method includes the steps of arranging a thermo-softening thermosetting adhesive between two circuit boards, thermally press-bonding the circuit boards to first soften or fluidize the adhesive and to bring the connection parts into mutual contact, further conducting heating to cause setting and establishing the mutual connection of the circuit boards. According to such a method, since the adhesive is sandwiched between the respective connection parts, the problem of short-circuit does not occur even when the pitch between the connection parts is fine. Since the connection parts are supported and fixed by the adhesive film, connection is not released by external stress and connection reliability can be improved. To minimize damage of the circuit boards during thermal press-bonding of the connection parts with one another, thermal press-bonding is preferably carried out at a low temperature and a low pressure. However, a thin layer of the adhesive is formed between the connection parts during thermal press-bonding at a low temperature and a low pressure particularly when the heat softening temperature of the adhesive is low, and connection between the connection parts is not always easy. To solve this problem, Patent Document 1 (Japanese Unexamined Patent Publication (Kokai) No. 2002-97424) proposes to apply concavo-convexity processing to at least one of the surfaces of each connection part of the circuit board to be connected. This technology can improve a contact pressure at the convexity portion during thermal press-bonding, enhances reliability of connection and eventually prevents connection defects.

The means described above requires the application of the processing such as emboss processing at the connection parts of the circuit boards and invites the addition of the production steps. Therefore, development of the method that does not require the additional step and moreover can acquire the effect at least equivalent to that of the means described above has been desired.

SUMMARY

Therefore, an object of the present invention is to provide a method for mutually connecting circuit boards, which method does not require any additional step such as emboss processing and can achieve similar easy connection.

According to one aspect, the invention provides a method for mutually connecting circuit boards, comprising the steps of (i) preparing a first circuit board having connection parts assigned to end parts of a plurality of conductor wirings, and a second circuit board having connection parts assigned to corresponding end parts of a plurality of conductor wirings, to which the first circuit board is connected; (ii) disposing the connection parts of the first circuit board to face the connection parts of the second circuit board with a thermosetting adhesive film being present between the connection parts of the first circuit board and the connection parts of the second circuit board; and (iii) applying heat and pressure to the connection parts and to the thermosetting adhesive film sufficiently high to thoroughly push away the adhesive film so as to establish electrical contact between connection parts of the circuit boards facing each other and to allow for curing of the adhesive; wherein the conductor wirings constituting the connection parts of at least one of the first and second circuit boards contain non-linear wirings.

The method described above is particularly effective when the viscosity of thermosetting adhesive film at 200° C. is adjusted to the range of 100 to 20,000 Pa·s.

Here, the term "first circuit board (first wiring board)" or "second circuit board (second wiring board)" used in this specification is the concept that includes not only ordinary circuit boards but also wiring board portions of flattened terminals of those functional devices (for example, piezoelectric devices, temperature sensors, optical sensors, etc).

The term "viscosity of the thermosetting adhesive film" is determined from the thickness ($h(t)$) (meter (m)) of a circular sample of adhesive film having a radius $a$ (meter (m)) is disposed between two horizontal plates and is aged for a time $t$ (seconds) while applying a constant load $F(N)$ at a measuring temperature $T$ (° C.), and calculated according to the following formula: $h(t)/h_o = [(4h_o^2 Ft)/(3\pi \eta a^4) + 1]^{-1/2}$ (wherein $h_o$ is an initial thickness (meter (m)) of thermosetting adhesive film, $h(t)$ is a thickness (meter (m)) of the adhesive film after $t$ seconds, $F$ is a load (N), $t$ is a time period (seconds) passed after imposing the load $F$, $\eta$ is a viscosity (Pa·s) at the measuring temperature $T°$ C., and $a$ is a radius (meter (m)) of the thermosetting adhesive film).

In the present invention, unlike conventional connection of FPC to another board by soldering, these boards are connected while the adhesive film is sandwiched between connection parts of respective boards. Therefore, the problem of short-circuit does not arise even when the connection parts are arrayed at a fine pitch. Furthermore, because the connection parts are supported and fixed by the adhesive film, this connection is not released by external stress and connection reliability can be elevated.

In the production of the circuit boards, the method of the invention does not require the additional production step such as emboss processing, can reliably connect the connection parts with one another during thermal press-bonding and can acquire connection having high reliability. Incidentally, since the non-linear wirings can be formed by a lithography technology in the production process of the printed circuit board, the non-linear wirings do not invite the additional step in the production process of the circuit board.

DETAILED DESCRIPTION OF PROCESS

The present invention is described with reference to the following embodiments, but the present invention is not limited to the embodiment described.

In the circuit board connected by the connection method of the invention, the conductive wirings constituting the connection parts include non-linear wirings. Here, the term "non-linear wiring" represents a wiring in which at least one of two (both) lateral edge portions of wiring which forms the connection parts is not linear. As long as the circuit board contains such wirings, the circuit board is not particularly limited. Examples of suitable circuit boards include, but not limited to a flexible circuit board (FPC), a circuit board using glass epoxy based circuit board, an aramide based circuit board, bis-maleimide-triazine (BT resin) based circuit board, a glass substrate or ceramic substrate having a wiring pattern formed of ITO or metal fine particles, a rigid circuit board such as a silicon wafer having connection parts of a metal conductor on its surface, and so forth. According to an aspect of the invention, since mutual connection can be attained by thermal press-bonding even at a low temperature and a low pressure, this aspect of the invention can be advantageously applied to those circuit boards which are likely to be damaged by thermal press-bonding. Therefore, a method of the invention exhibits its effect particularly when at least one of the circuit boards is a flexible printed circuit board (FPC). The circuit boards connected with one another by a method of the invention can be used in electronic apparatuses such as digital cameras, cell telephones, printers, and so forth.

Figure 1:
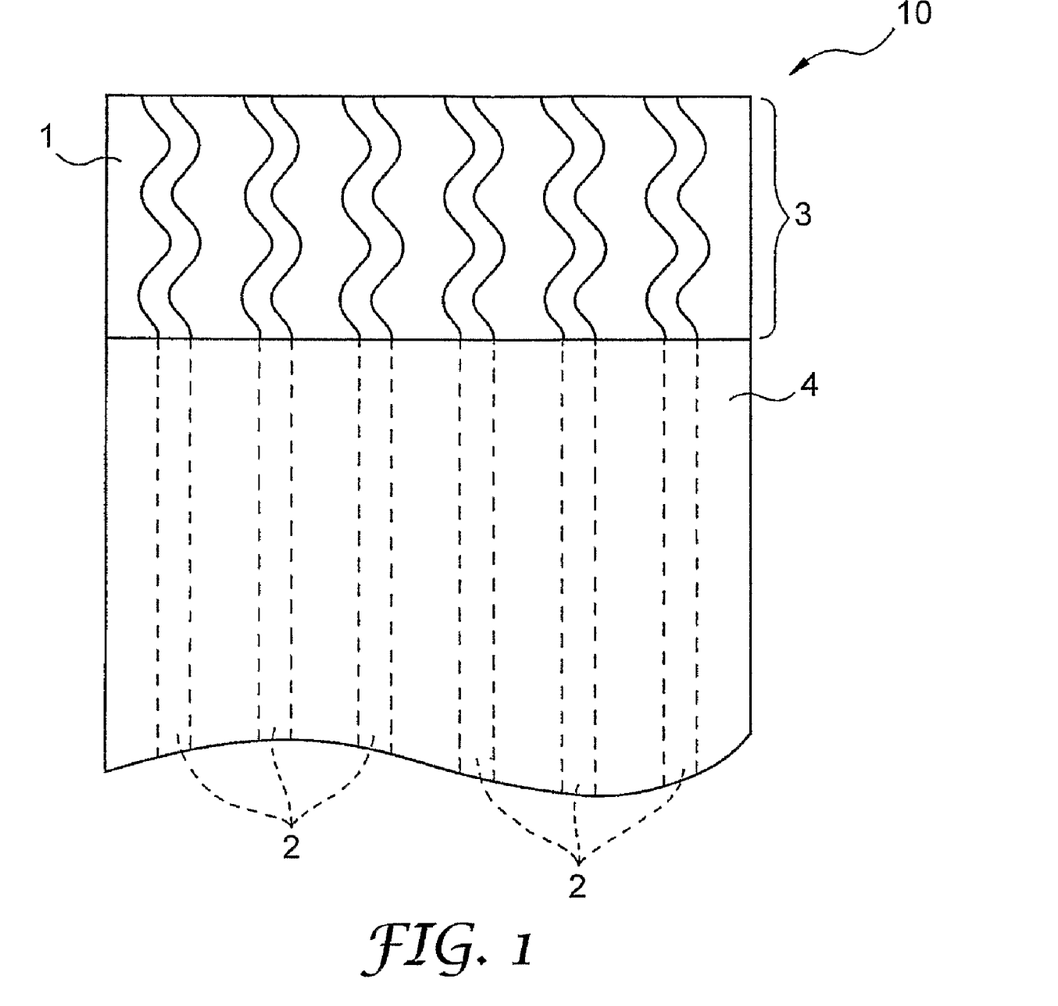
FIG. 1 is a perspective view showing the top surface of FPC according to an embodiment of the invention that is usable in the method of the present invention.

The present invention will be hereinafter explained with reference to the drawings. Though the explanation will be given in the drawing about the flexible circuit board, the circuit boards used in the invention are not limited to the flexible circuit board. FIG. 1 is a top perspective view of a circuit board that can be used in the method of the invention. The circuit board is a circuit board 10 (FPC) having wirings 2 on the top surface of the board 1 (resin film) with connection parts 3 at the distal ends. Usually, the portions except for the connections parts 3 are covered with an insulating film 4 to ensure electric insulation. The connection parts 3 are non-linear wirings and have wirings of a corrugation shape. The other portions of the wiring may also be non-linear if desired.

Figure 2A:
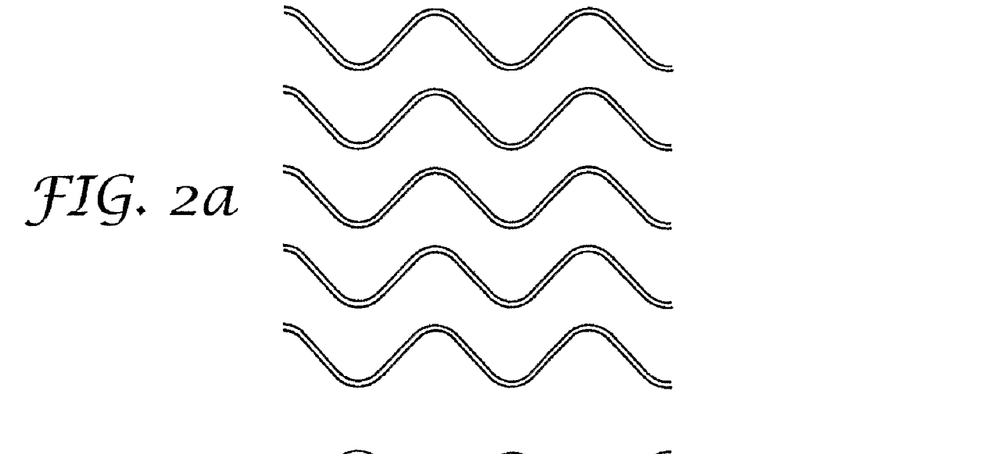
FIG. 2 shows one embodiment of a non-linear wiring at the connection parts of the circuit board.
Figure 2B:
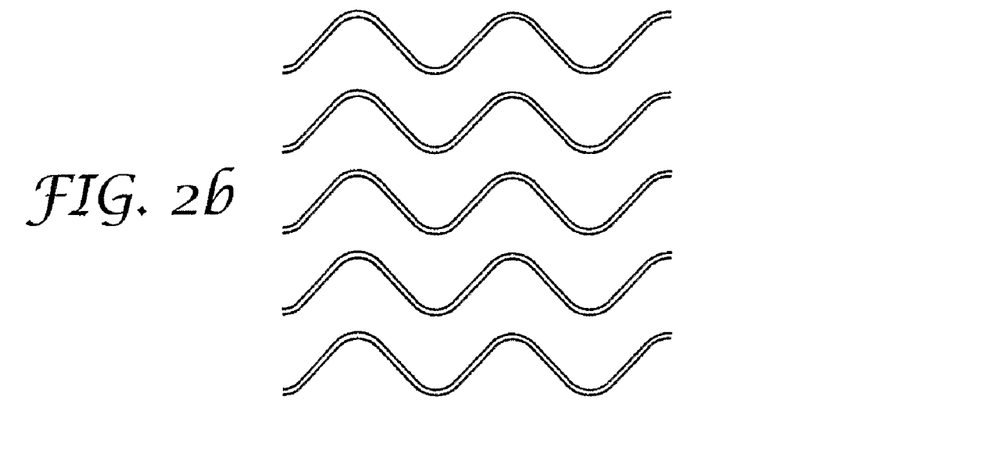
Figure 2C:
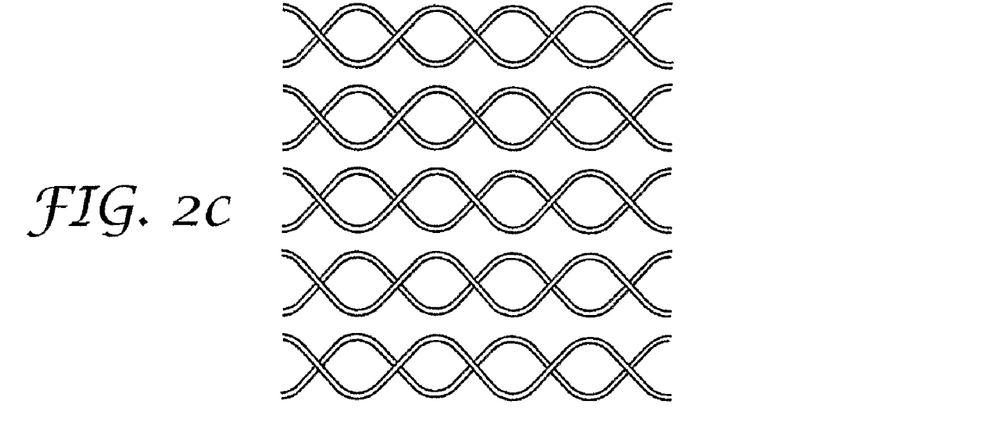
Figure 3A:
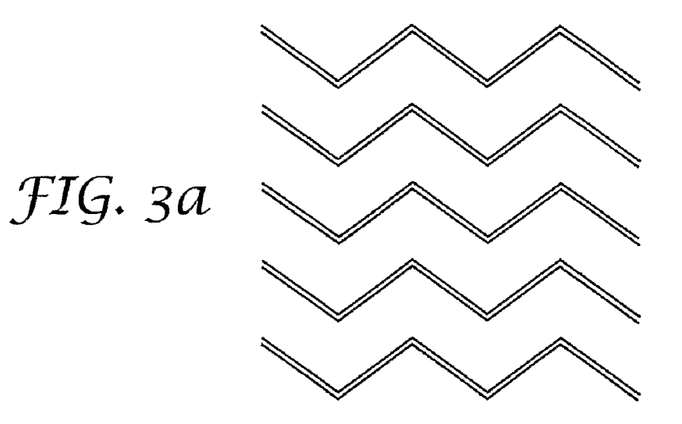
FIG. 3 shows another embodiment of a non-linear wiring at the connection parts of the circuit board.
Figure 3B:
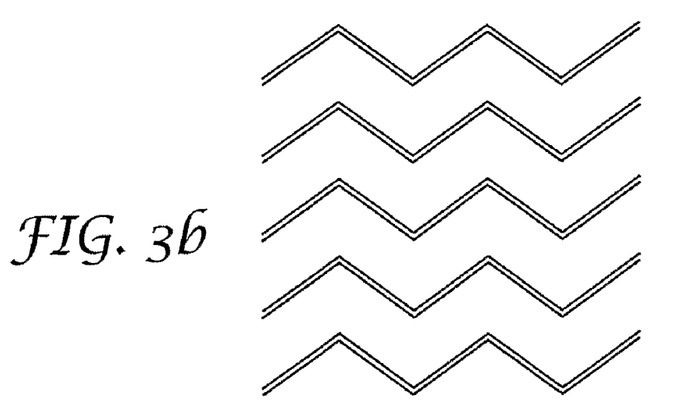
Figure 3C:
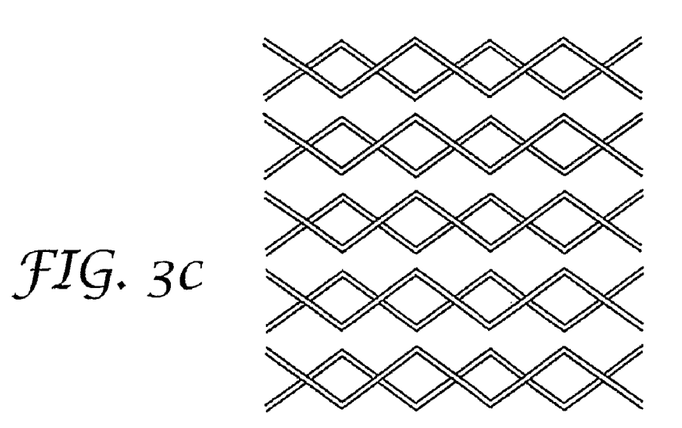
Figure 4A:
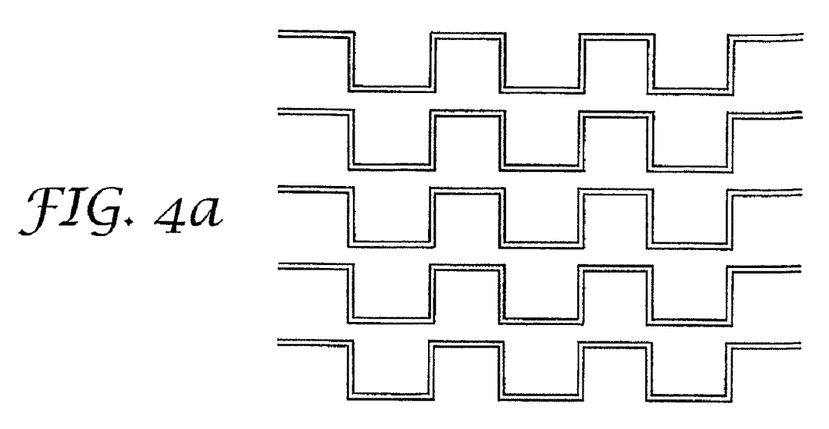
FIG. 4 shows another embodiment of a non-linear wiring at the connection parts of the circuit board.
Figure 4B:
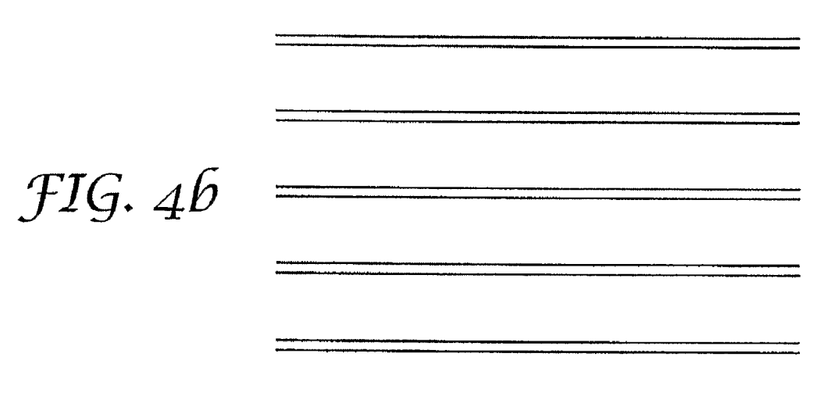
Figure 4C:
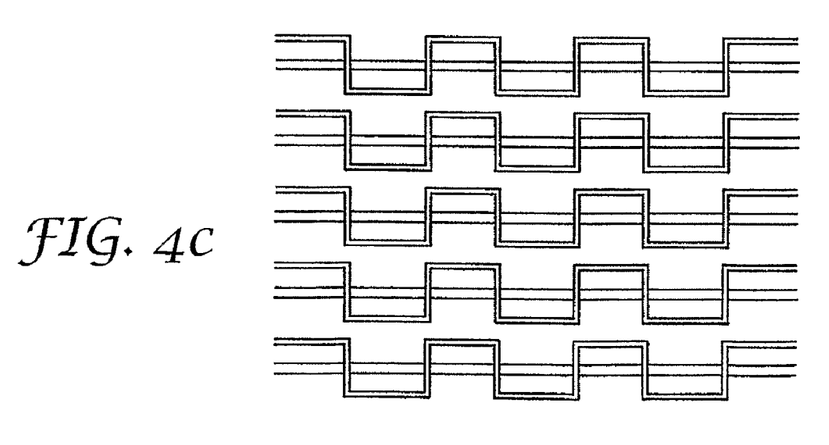
Figure 5A:
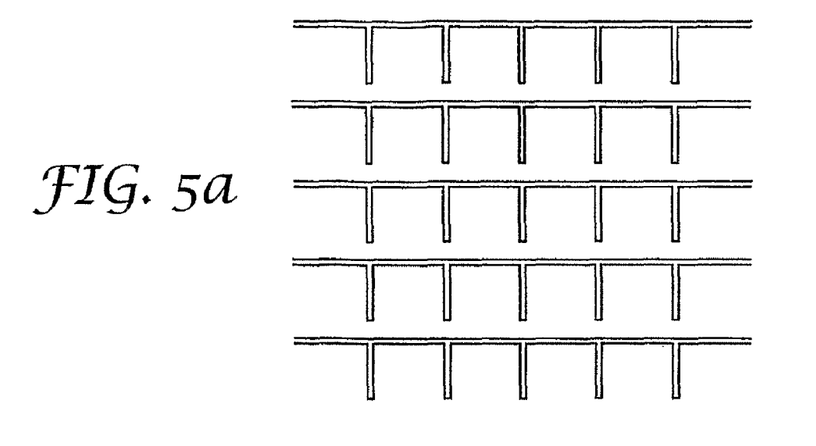
FIG. 5 shows another embodiment of a non-linear wiring at the connection parts of the circuit board.
Figure 5B:
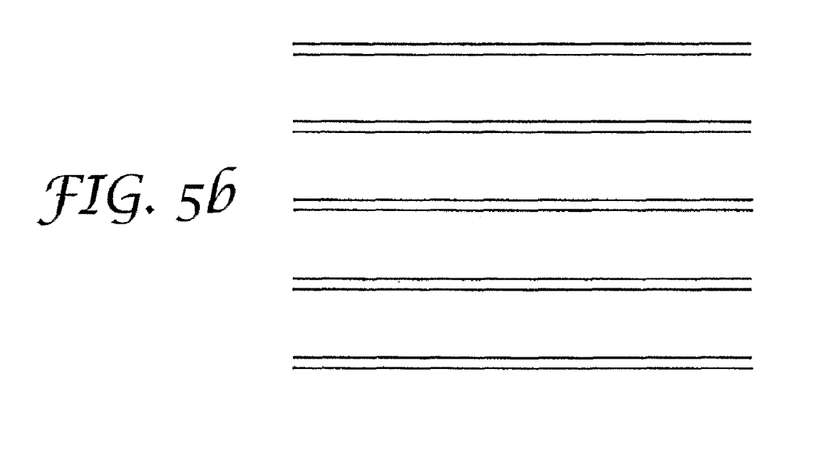
Figure 5C:
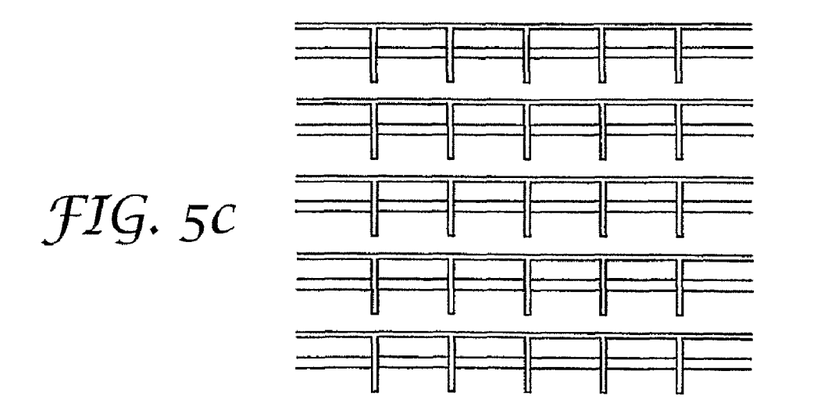
Figure 6A:
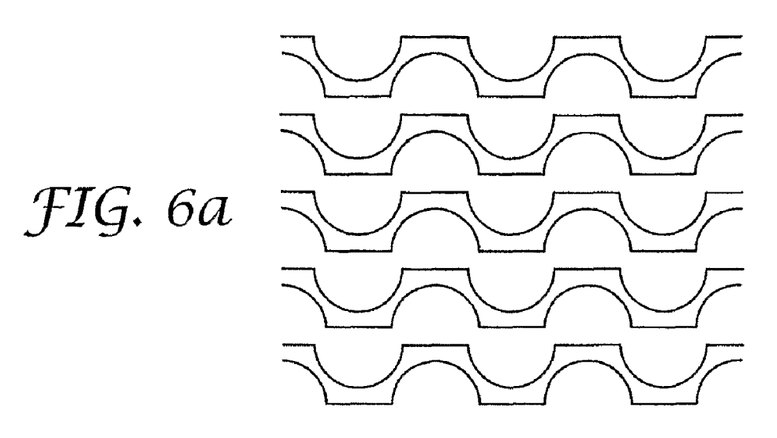
FIG. 6 shows another embodiment of a non-linear wiring at the connection parts of the circuit board.
Figure 6B:
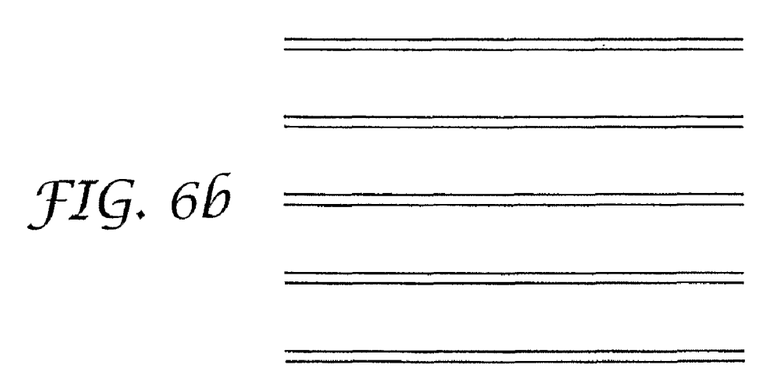
Figure 6C:
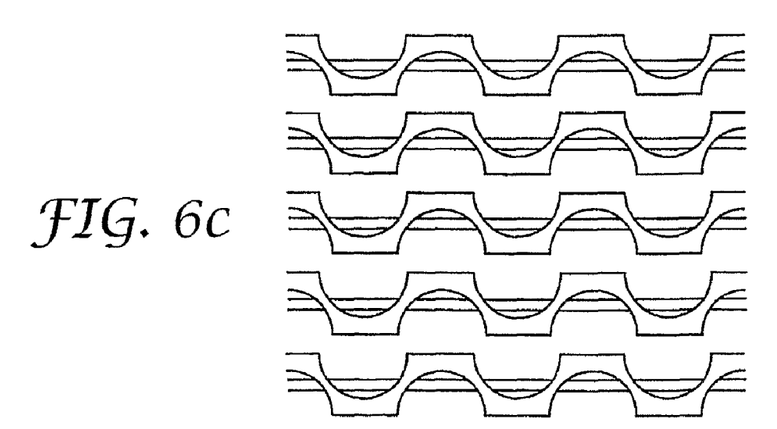

FIGS. 2 to 6 show several shapes of the non-linear wirings at the connection parts of the circuit boards. In the drawings, (a) shows the wiring shape of the first circuit board, (b) shows the wiring shape of the second circuit board and (c) shows the wiring shape under the connection state. As shown in the drawings, a plurality of contacts exists at the connection parts to ensure connection. Because the area of the contact portion is only a part of the wiring, the pressure can be elevated during thermal press-bondinging and connection can be made reliable. Generally, the area of the contact portion of the wiring has preferably a ratio of 0.1 to 0.5 to the whole area of the connection surface. For example, FIG. 4 is taken as an example for explanation. When the ratio (R) of the area of the connection parts of the wiring to the whole area of the wirings on the connection surface is smaller at a predetermined pressure, the surface pressure to the contact parts can be more secured, while the intervals between the contact parts becomes larger. Therefore, in order to establish multi-point connection, the area of the contact surface needs to be increased. This will reduce an area for mounting other parts which is not desired. In consideration of these factors, R is preferably at least 0.1. On the other hand, when the wiring pattern of the printed wiring board is produced in the finest pattern by a subtractive method, or the like, the pattern becomes of a ratio of a line width to a space of 1:1 (e.g. line width 100 µm/space width 100 µm). This ratio will result in a design wherein the number of the contact portions by the non-linear wirings is the highest in FIG. 4 and thus the upper limit of R is preferably 0.5. The wiring itself of the non-linear wiring may be non-liner as shown in FIGS. 2 to 4 or the edge portions of the linear wiring may be non-linear as shown in FIGS. 5 and 6. When the non-linear wirings are contained in at least one of the first and second circuit boards, the effect of the invention can be acquired.

The material for the conductor wiring may be a conductor such as solder (e.g., Sn—Ag—Cu), copper, nickel and gold. Also, in view of the connecting property, the surface may be finished, for example, by plating a material such as tin, gold, nickel and nickel/gold two-layered plating. The substrate of FPC may be a resin film usually used for FPC, such as a polyimide film.

Figure 7A:
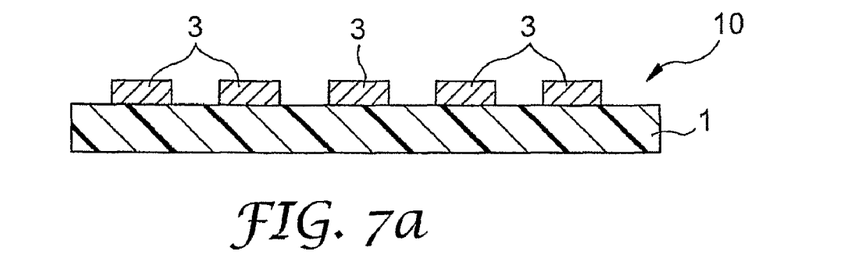
FIG. 7 shows a process flow diagram of the connection method of the present invention.
Figure 7B:
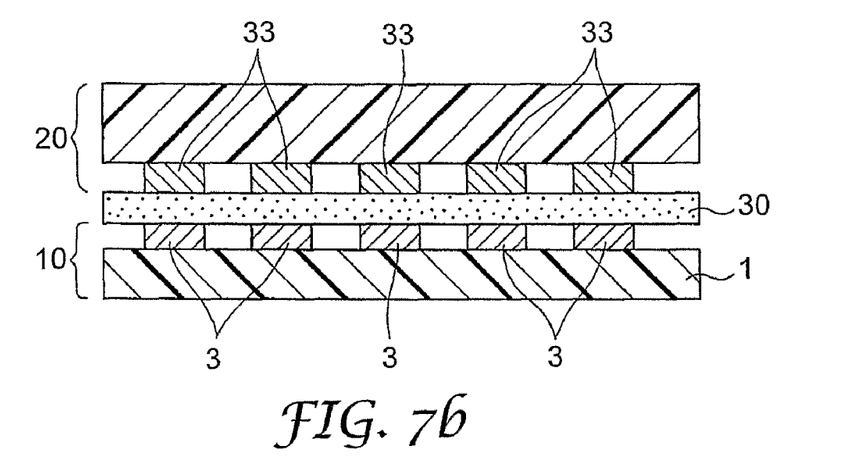
Figure 7C:
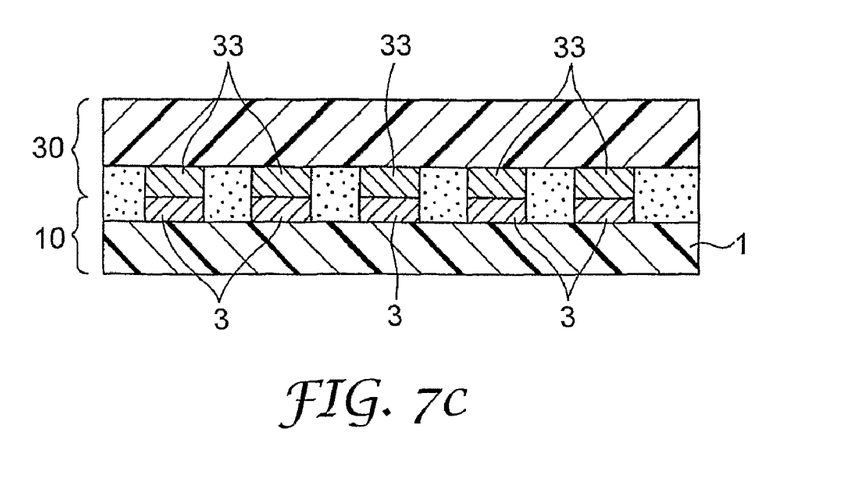

The connection method of the present invention will be described step-wise. FIG. 7 is a process view of the connection method of the invention. First, a first circuit board 10 (for example, a flexible printed circuit board (FPC)) having formed thereon conductor wirings 2 on a substrate 1 (for example, resin film) is prepared (step (a)). Next, a second circuit board 20 to which this first circuit board 10 is to be connected is prepared, and the connection parts 3 of the first circuit board and the connection parts 33 of the second circuit board 20 are aligned and superposed one upon another through a thermosetting adhesive film 30 (step (b)). The resulting stacked body of these superposed first circuit board 10, thermosetting adhesive film 30 and second circuit board 20 is press-bonded under heat to establish electrical connection between the connection parts 3 of the first circuit board 10 and the connection parts 33 of the second circuit board 20 (step (c)). The thermosetting adhesive film 30 may be heat-laminated in advance on the connection parts of first circuit board 10 or second circuit board 20.

Press-bonding under heat can be performed by using a heat bonder capable of applying heat and pressure, such as pulse heat bonder and ceramic heat bonder. In using the heat bonder, a stack of the first and second circuit boards to be connected via the thermosetting adhesive film is placed on a low heat-conductive support such as a quartz glass, a heated bonder head is placed and pressed on the stack, to effect press-bonding under heat. Press-bonding of the first or second circuit board by the bonder head is preferably effected via a heat-resistant elastic sheet such as polytetrafluoroethylene (PTFE) film or silicone rubber. If such an elastic sheet is used and the circuit board on the side of the bonder head is FPC, the resin film the FPC is pushed at the press-bonding under heat and a stress (spring back) is generated due to deflection of the resin film of the FPC. The FPC holds the deflected state after curing of adhesive film, whereby the contact pressure is maintained at the connection parts and connection stability is elevated.

Press-bonding under heat is performed by compressing the stacked body with a heated flat plate. The temperature and pressure at the press-bonding under heat are not limited and they are determined in accordance with the resin composition, or the like, of the adhesive film selected. In the present invention, an adhesive film which is softened at about 100° C. or more and can be cured at about 150 to 250° C. is generally preferred. To heat-laminate in advance the adhesive film on the circuit board, press-bonding under heat is performed at a heating temperature of about 150 to 230° C. for a heating time of 1 to 10 seconds under a pressure at 100 to 1,000 N/cm². By this treatment, the adhesive film is softened and bonded to the first circuit board but curing thereof slightly proceeds and the thermosetting property is maintained. At the time of connection to the second circuit board, press-bonding under heat is performed to conduct curing at a temperature of 150 to 250° C. for from 1 second to several minutes under a pressure of 200 to 2,000 N/cm².

The thermosetting adhesive film for use in the present invention will be described below. In the present invention, a thermosetting adhesive film containing a resin capable of being softened when heated at a certain temperature and being cured when further heated is used. The resin having such softening and thermosetting properties is a resin containing both a thermoplastic component and a thermosetting component. In a first embodiment, the thermo-softening and thermosetting resin may be a mixture of a thermoplastic resin and a thermosetting resin. In a second embodiment, the thermo-softening and thermosetting resin may be a thermosetting resin modified with a thermoplastic component. Examples of the resin in the second embodiment include a polycaprolactone-modified epoxy resin. In the third embodiment, the thermo-softening and thermosetting resin may be a polymer resin having a thermosetting group such as an epoxy group in the basic structure of a thermoplastic resin. Examples of such a polymer resin include a copolymer of ethylene and glycidyl (meth)acrylate.

The thermosetting adhesive film that can be used in the present invention is preferably a thermosetting adhesive film having a viscosity of 100 to 20,000 Pa·s at a temperature of 200° C. The term "viscosity of thermosetting adhesive film" is determined from the thickness (h(t)) of a circular sample of an adhesive film having a radius a (meter (m)) is disposed between two horizontal flat plates and is aged for a time period t (seconds) while applying a constant load F (N) at a measuring temperature T (° C.), and is calculated according to the following formula: $h(t)/ho = (4ho^2 Ft)/(3\pi\eta a^4) + 1]^{-1/2}$ (wherein ho is an initial thickness (meter (m)) of thermosetting adhesive film, h(t) is a thickness (meter (m)) of adhesive film after t seconds, F is a load (N), t is a time period (seconds) passed after imposing the load F, η is a viscosity (Pa·s) at the measuring temperature T° C., and a is a radius (meter (m)) of thermosetting adhesive film).

In the present invention, the viscosity is preferably falls within the range described above for the following reasons. When the viscosity at 200° C. is 100 Pa·s or more, the adhesive film can have a sufficiently high viscosity at the short-time press-bonding under heat at 150 to 250° C., a stress (spring back effect) owing to deflection of resin film of FPC can be obtained as described above, and connection stability can be maintained. For example, when the resin film is a 25 μm-thick polyimide film and when the viscosity of the adhesive film is 100 Pa·s or more at 200° C., good connection stability is obtained. If the viscosity of the adhesive film is too high, the resin can be hardly pushed away from between wired conductors in the connection parts even when a high pressure is applied. When the viscosity of the adhesive film is 20,000 Pa·s or less at 200° C., connection between conductors can be established by press-bonding under heat at the pressure described above. For forming a thermoplastic adhesive film having a viscosity within the above-described range, it is effective to partially cure an adhesive containing a curable resin to a B-stage.

In particular, a thermosetting adhesive composition that can be suitably used for the adhesive film is a thermosetting adhesive composition containing a caprolactone-modified epoxy resin. Such a thermosetting adhesive composition usually has a crystalline phase. In at least one embodiment, this crystalline phase comprises a caprolactone-modified epoxy resin (hereinafter sometimes referred to as a "modified epoxy resin") as the main component. The modified epoxy resin can impart appropriate flexibility to the thermosetting adhesive composition and can thereby improve the viscoelastic property of the thermosetting adhesive. By virtue of this effect, the thermosetting adhesive can be made to have cohesive force even before curing and can express adhesive strength under heat. Furthermore, this modified epoxy resin becomes a cured product having a three-dimensional network structure when heated, similarly to normal epoxy resin, and can impart cohesive force to the thermosetting adhesive.

From the standpoint of improvement of the initial adhesive force, the modified epoxy resin usually has an epoxy equivalent of about 100 to about 9,000, preferably from about 200 to about 3,000, more preferably from about 500 to about 3,000. A proper modified epoxy resin having such an epoxy equivalent is commercially available, for example, from Daicel Chemical Industries, Ltd. under the trade name of Placcel™ G Series (for example, G402).

The thermosetting adhesive composition preferably contains a melamine/isocyanuric acid adduct (hereinafter sometimes referred to as a "melamine/isocyanuric acid complex") in combination with the modified epoxy resin described above. A useful melamine/isocyanuric acid complex is commercially available, for example, from Nissan Chemicals Industries, Ltd. under the trade name of MC-600 and this is effective for toughening the thermosetting adhesive composition, preventing the thermosetting adhesive composition from causing tack due to expression of thixotropy before heat curing, and inhibiting moisture absorption and fluidity of the thermosetting adhesive composition. In order to prevent embrittlement after curing without impairing these effects, the thermosetting adhesive composition may contain the melamine/isocyanuric acid complex in an amount of usually from 1 to 200 parts by weight, preferably from 2 to 100 parts by weight, more preferably from 3 to 50 parts by weight, per 100 parts by weight of the modified epoxy resin.

The thermosetting adhesive composition has strength sufficiently high to connect the circuit boards in normal use and moreover can be cured so that the cured product can be softened when heated. This is possible because curing can be effected in the mode in which a thermosetting adhesive is cured in a controlled way.

To use a caprolactone-modified epoxy resin as the thermosetting resin, the thermosetting adhesive composition may further contain a thermoplastic resin to enhance the repair property. The term "repair property" means ability such that after completion of connection, the adhesive film can be peeled off under heat and connection can be again performed. In the present invention, after connecting the first circuit board to the second circuit board, the first and second circuit boards may be separated at a temperature of 120 to 200° C. and the connection step is again repeated, whereby the repair property can be exerted. A thermoplastic resin that can suitably be used here is a phenoxy resin. The phenoxy resin is a thermoplastic resin having a chained or linear structure and a relatively high molecular weight, and is typically formed from epichlorohydrin and bisphenol A. This phenoxy resin has high processability and facilitates processing of the thermosetting adhesive composition into an adhesive film. According to one embodiment of the present invention, the thermosetting adhesive composition contains the phenoxy resin in an amount of usually from 10 to 300 parts by weight, preferably from 20 to 200 parts by weight, per 100 parts by weight of the modified epoxy resin. This is because the phenoxy resin can be effectively rendered compatible with the modified epoxy resin and in turn, the modified epoxy resin can be effectively prevented from bleeding out from the thermoplastic adhesive composition. Furthermore, the phenoxy resin can intertwine with the cured product of the modified epoxy resin described above to further enhance the final cohesive force, heat resistance, and the like, of the thermosetting adhesive layer.

In combination with, or independently of, the phenoxy resin described above, the thermosetting adhesive composition may optionally further contain a second epoxy resin (hereinafter sometimes simply referred to as an "epoxy resin"). This epoxy resin is not particularly limited as long as the scope of the present invention is observed. Examples of the epoxy resin that can be used include bisphenol A-type epoxy resin, bisphenol F-type epoxy resin, bisphenol A diglycidyl ether-type epoxy resin, phenol novolak-type epoxy resin, cresol novolak-type epoxy resin, fluorene epoxy resin, glycidyl amine resin, aliphatic epoxy resin, bromated epoxy resin and fluorinated epoxy resin. Such an epoxy resin is readily rendered compatible with the phenoxy resin similarly to the modified epoxy resin and scarcely bleeds out from the thermoplastic adhesive composition. In particular, the thermosetting adhesive composition preferably contains the second epoxy resin in an amount of 50 to 200 parts by weight, more preferably from 60 to 140 parts by weight, per 100 parts by weight of the modified epoxy resin, and this is advantageous from the standpoint of enhancing the heat resistance.

In practicing the present invention, particularly a bisphenol A diglycidyl ether-type epoxy resin (hereinafter sometimes referred to as "diglycidyl ether-type epoxy resin") is preferably used as the second epoxy resin. This diglycidyl ether-type epoxy resin is in a liquid state and can improve, for example, high-temperature properties of the thermosetting adhesive composition. For example, when the diglycidyl ether-type epoxy resin is used, the chemical resistance or glass transition temperature in the curing at a high temperature can be improved. Also, curing agents over a wide range can be applied and the curing conditions are relatively mild. Such a diglycidyl ether-type epoxy resin is commercially available, for example, from Dow Chemical (Japan) under the trade name of D.E.R. 332.

A curing agent may be added to the thermosetting adhesive composition, if desired, and may be used for the curing reaction of the epoxy resin. The curing agent is not particularly limited in its amount used and its kind as long as desired effects can be provided, but from the standpoint of enhancing the heat resistance, the curing agent is usually contained in an amount of 1 to 50 parts by weight, preferably from 2 to 40 parts by weight, more preferably from 5 to 30 parts by weight, per 100 parts by weight in total of the epoxy resins. Examples of the curing agent which can be used include, but are not limited to, an amine curing agent, an acid anhydride, a dicyandiamide, a cationic polymerization catalyst, an imidazole compound and a hydrazine compound. Among these, a dicyandiamide is a promising curing agent because it has thermal stability at room temperature. Also, for use in the present invention, a fluorene amine curing agent is particularly useful in view of adhesive force at a high temperature of the adhesive film after curing. The fluorene amine curing agent is available, for example, from Nippon Steel Chemical Co., Ltd. under the trade name of BAFL.

In the thermosetting adhesive composition, an organic particle can be added in an amount of 15 to 100 parts by weight per 100 parts by weight of the adhesive composition. By the addition of an organic particle, while the resin exhibits plastic fluidity, the organic particle maintains flexibility after curing of the thermoplastic adhesive composition. Also, heating in the connection step may cause evaporation of the moisture adhering to the first or second circuit board to incur activity of a water vapor pressure, but even in such a case, the resin is prevented from flowing and confining an air bubble.

Examples of the organic particle added include particles of acrylic resin, styrene-butadiene-based resin, styrene-butadiene-acrylic resin, melamine resin, melamine-isocyanurate adduct, polyimide, silicone resin, polyetherimide, polyethersulfone, polyester, polycarbonate, polyether ether ketone, polybenzimidazole, polyarylate, liquid crystal polymer, olefin-based resin and ethylene-acryl copolymer. The size of the particle is not greater than 10 μm, preferably not greater than 5 μm.

EXAMPLE

The composition shown in Table 1 below was coated on a silicone-treated polyester film and was dried to form a film having a thickness of 30 μm.

TABLE 1

Table 1: Resin Composition

| Component | Parts by Weight |
| --- | --- |
| YP50S | 30 |
| DER332 | 34 |
| G402 | 30 |
| BAFL | 16.4 |
| MC600 | 20 |
| EXL2314 | 80 |
| THF | 600 |

Phenoxy Resin:
  YP50S, produced by Tohto Kasei Co., Ltd., number average molecular weight: 11,800

Epoxy Resin:
  DER332, produced by Dow Chemical Japan Ltd., epoxy equivalent: 174

Polycaprolactone-Modified Epoxy Resin:
  G402, produced by Daicel Chemical Industries, Ltd., epoxy equivalent: 1,350

Bis-Aniline Fluorene:
  BAFL, Nippon Steel Chemical Co., Ltd.

Melamine Isocyanuric Acid Complex:
  MC-600, produced by Nissan Chemicals Industries, Ltd.

Acryl Particle:
  EXL2314, KUREHA PARALOID EXL, produced by Kureha Chemical Industry Co., Ltd.

THF: Tetrahydrofuran

The film so formed was heat-treated at 100° C. by variously changing the treating time, and the viscosity at 200° C. of the films prepared was measured. The viscosity was measured in the following way. The adhesive film sample was cut into a circular shape having a radius a (meter (m)) (0.005 m), the resulting thermosetting adhesive film sample was disposed between two horizontal plates and aged for a time period t (seconds) while applying a constant load F (N) (650 N) at 200° C., and the viscosity was calculated in accordance with the following formula: $h(t)/ho=(4ho^2Ft)/(3\pi\eta a^4)+1]^{-1/2}$ (wherein ho is an initial thickness (meter (m)) of thermosetting adhesive film, h(t) is a thickness (meter (m)) of adhesive film after t seconds, F is a load (N), t is a time period (seconds) passed after imposing the load F, η is a viscosity (Pa·s) at the measuring temperature T° C., and a is a radius (meter (m)) of thermosetting adhesive film).

The results are shown in Table 2 below.

TABLE 2

Table 2: Viscosity of Adhesive Film after Heat Treatment

| Heat-Treating Time (min) | Viscosity at 200° C. (Pa · s) |
| --- | --- |
| 55 | 1,170 |
| 60 | 1,870 |
| 62 | 2,390 |
| 65 | 4,360 |
| 67 | 8,600 |
| 70 | 14,100 |
| 75 | 25,500 |
| 80 | 38,800 |
| 90 | 55,000 |

An FPC having, on a 25 μm-thick polyimide film, conductor wirings (nickel having thereon gold plating) consisting of corrugated wirings that were formed in such a fashion that a pitch between conductors was 0.3 mm, a conductor width was 0.05 mm, a conductor-to-conductor distance was 0.25 mm, a conductor thickness was 18 μm and an amplitude width of ±0.15 mm, was prepared as a first circuit board. Separately, a glass epoxy substrate having a pitch between conductors of 0.3 mm, a conductor width of 0.05 mm, conductor-conductor distance of 0.25 mm and a conductor thickness of 18 μm was prepared as a second circuit board. The glass epoxy substrate had 50 conductor wirings thereon, and respective two adjacent wirings were paired and electrically conducted. On the other hand, FPC had 50 conductor wirings thereon, and respective two adjacent conductor wirings were paired and electrically conducted.

These FPC and glass epoxy substrate were superposed one upon another through the adhesive film prepared above by heat treatment at 100° C. for 60 minutes. This stacked body of FPC/adhesive film/glass epoxy substrate was press-bonded under heat and thereby connected to establish connection at 6 connection points for each of wirings. At this connection, Pulse Bonder TCW-215/NA-66 (available from Nippon Avionics Co., Ltd.) was used and press-bonding under heat was performed for 3 seconds at a head temperature of 200° C. with a load of 280 N (pressure 900 N/cm²). The resistance value of the sample after joining was measured (initial value: 6.2 ohm). Subsequently, the sample was charged into an oven at a temperature of 85° C. and a humidity of 85% for 1,000 hours, thereby effecting accelerated aging, and then the resistance value was again measured. As a result, the increase in the resistance value was within 2% of the initial value and it was verified that good connection was established.

The invention claimed is:

1. A method for mutually connecting circuit boards, comprising the steps of:
   preparing a first circuit board having connection parts assigned to end parts of a plurality of conductor wirings, and a second circuit board having connection parts assigned to corresponding end parts of a plurality of conductor wirings, to which said first circuit board is connected;
   disposing the connection parts of said first circuit board to face the connection parts of said second circuit board with a thermosetting adhesive film being present between the connection parts of said first circuit board and the connection parts of said second circuit board; and
   applying heat and pressure to said connection parts and to said thermosetting adhesive film sufficiently high to thoroughly push away the adhesive film so as to establish electrical contact between connection parts of said circuit boards facing each other and to allow for curing of the adhesive;
   wherein the conductor wirings constituting said connection parts of at least one of said first and second circuit boards contain non-linear wirings.

2. The method as claimed in claim 1, wherein an area at the contact portion of the wiring is 0.1 to 0.5 with respect to the total area of the wirings of the connection surface.

3. The method as claimed in claim 1, wherein said thermosetting adhesive film has a viscosity of 100 to 20,000 Pa·s at 200° C.

4. The method as claimed claim 1, wherein said thermosetting adhesive film contains a caprolactone-modified epoxy resin.

5. The method as claimed in claim 4, wherein said thermosetting adhesive film is adjusted to have a viscosity of 100 to 20,000 Pa·s at 200° C. by preliminarily heat-treating a thermosetting resin containing a caprolactone-modified epoxy resin.

6. The method as claimed in claim 4, wherein said thermosetting adhesive film contains a fluoreneamine-based curing agent.

7. The method as claimed in claim 1, wherein the conductor wiring constituting the connection parts of said circuit board is surface-treated by tin, gold, nickel or a two-layered plating of nickel/gold.

8. The method as claimed in claim 1, wherein the connection is performed at a temperature of 150 to 250° C.

9. The method as claimed in claim 8, wherein after said first circuit is connected to said second circuit board, said first and second circuit boards are separated at a temperature of 120 to 200° C. and the steps (ii) and (iii) are again repeated.

10. The method as claimed in claim 1, wherein a circuit board obtained by mutually connecting said first and second circuit boards is used in mobile telephones.

* * * * *

UNITED STATES PATENT AND TRADEMARK OFFICE
CERTIFICATE OF CORRECTION

PATENT NO. : 7,779,538 B2  
APPLICATION NO. : 11/917527  
DATED : August 24, 2010  
INVENTOR(S) : Yoshiaki Sato et al.

Page 1 of 1

It is certified that error appears in the above-identified patent and that said Letters Patent is hereby corrected as shown below:

On the Title page
Left column, item (86), delete "PCT/JP2006/023997" and insert -- PCT/US2006/023997 --, therefor.

Column 3
Line 44, delete "bis-maleimide-triazine" and insert -- bis-maleimide triazine --, therefor.

Column 4
Line 13, delete "press-bondinging" and insert -- press-bonding --, therefor.

Column 10
Line 40, in Claim 4, after "claimed" insert -- in --.

Signed and Sealed this  
Fifteenth Day of February, 2011

David J. Kappos  
*Director of the United States Patent and Trademark Office*